United States Patent
Sirbu et al.

(10) Patent No.: US 10,396,527 B2
(45) Date of Patent: Aug. 27, 2019

(54) VERTICAL-CAVITY SURFACE-EMITTING LASER WITH HIGH MODULATION SPEED

(71) Applicant: Mellanox Technologies, Ltd., Yokneam (IL)

(72) Inventors: Alexei Sirbu, Cugy (CH); Vladimir Iakovlev, Ecublens (CH); Yuri Berk, Kiryat Tivon (IL); Itshak Kalifa, Ramat Gan (IL); Elad Mentovich, Tel Aviv (IL); Sylvie Rockman, Zichron Yaakov (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 15/622,294

(22) Filed: Jun. 14, 2017

(65) Prior Publication Data

US 2018/0366905 A1    Dec. 20, 2018

(51) Int. Cl.
| | | |
|---|---|---|
| *H01S 5/183* | (2006.01) | |
| *H01S 5/20* | (2006.01) | |
| *H01S 5/30* | (2006.01) | |
| *H01S 5/062* | (2006.01) | |
| *H01S 5/343* | (2006.01) | |

(52) U.S. Cl.
CPC ........ *H01S 5/18316* (2013.01); *H01S 5/1833* (2013.01); *H01S 5/1838* (2013.01); *H01S 5/18308* (2013.01); *H01S 5/18333* (2013.01); *H01S 5/2081* (2013.01); *H01S 5/06226* (2013.01); *H01S 5/18341* (2013.01); *H01S 5/18347* (2013.01); *H01S 5/3095* (2013.01); *H01S 5/34366* (2013.01)

(58) Field of Classification Search
CPC .. H01S 5/18316; H01S 5/1838; H01S 5/1064; H01S 5/183–18397
See application file for complete search history.

(56) References Cited

U.S. PATENT DOCUMENTS

| | | | |
|---|---|---|---|
| 2002/0101894 A1* | 8/2002 | Coldren | B82Y 20/00 372/43.01 |
| 2008/0137692 A1* | 6/2008 | Park | B82Y 20/00 372/4 |

OTHER PUBLICATIONS

Backer, A. et al.; "Transverse Optical Mode Analysis of Long-Wavelength VCSEL in High Single-Mode Operation"; Proc. of 8th Int. Conf. of Numerical Simulation of Optoelectronic Devices (NUSOD); pp. 87-88; 2008.

Caliman, A. et al.; "25 Gbps Direct Modulation and 10 km Data Transmission with 1310 nm Waveband Wafer Fused VCSELs"; Optics Express; vol. 24, No. 15; Jul. 25, 2016; pp. 16329-16335.

(Continued)

*Primary Examiner* — Tod T Van Roy
(74) *Attorney, Agent, or Firm* — Alston & Bird LLP (57) ABSTRACT

A vertical-cavity surface-emitting laser (VSCEL) and method for producing a VCSEL are described, the VCSEL including an undercut active region. The active region of the VCSEL is undercut relative to current-spreading layers of the VCSEL, such that a width of a tunnel junction of the VCSEL overgrown by a current spreading layer is less than a width of an active region of the VCSEL, and a width of the active region of the VCSEL is less than a width of the overgrown current-spreading layer, such that the VCSEL including the undercut active region is configured to transmit data at speeds greater than 25 gigabits/second.

16 Claims, 7 Drawing Sheets

(56) References Cited

OTHER PUBLICATIONS

Feezell, D. et al.; "InP-Based 1.3-1.6 µm VCSELs With Selectively Etched Tunnel-Junction Apertures on a Wavelength Flexible Platform"; IEEE Photonics Technology Letters; vol. 17, No. 10; Oct. 2005; pp. 2017-2019.

Kapon, Eli et al.; "Power-Efficient Answer"; Nature Photonics; vol. 3; Jan. 2009; pp. 27-29.

Lin, Chao-Kun et al.; "High Temperature Continuous-Wave Operation of 1.3- and 1.55-µm VCSELs With InP/Air-Gap DBRs"; IEEE Journal of Selected Topics in Quantum Electronics; vol. 9, No. 5; Sep./Oct. 2003; pp. 1415-1421.

Sirbu, Alexei et al.; "Reliability of 1310 nm Wafer Fused VCSELs"; IEEE Photonics Technology Letters; vol. 25, No. 16; Aug. 15, 2013; pp. 1555-1558.

Sirbu, Alexei et al.; "Wafer-Fused Heterostructures: Application to Vertical Cavity Surface-Emitting Lasers Emitting in the 1310 nm Band"; Semiconductor Science and Technology; 26 (2011) 014016 (6pp); published Nov. 29, 2010.

Spiga, S. et al.; "Single-Mode 1.5-µm VCSEL with 22-GHz Small-Signal Bandwidth"; Proceedings of the European VCSEL day—2016; Darmstadt; Jun. 3, 2016; 3 pages.

Spiga, S. et al.; "Single-Mode 1.5-µm VCSELs with Small-Signal Bandwidth Beyond 20 GHz"; ICTON—2016; paper Mo.D5.3; 2016; pp. 1-4.

\* cited by examiner

VERTICAL-CAVITY SURFACE-EMITTING LASER WITH HIGH MODULATION SPEED

BACKGROUND

Embodiments of the present invention relate generally to increasing the efficiency and speed of optical communications utilizing lasers for fiber-optic digital and analog transmission. More specifically, embodiments of the present invention relate to a vertical-cavity surface-emitting laser (VSCEL) for use in fiber-optic data and analog transmission through fiber optic cable systems. Designs, VCSELs, and methods are therefore described that allow for increased transmission speeds through the fiber optic cable systems by utilizing a new type of VCSEL.

BRIEF SUMMARY

The use of VCSELs for optical transmission in fiber optic systems has provided several advantages over commonly used edge-emitting lasers. For example, VCSELs require less power consumption and can be manufactured more efficiently than edge-emitting lasers. One aspect of this efficiency is provided by the on-wafer testing capability of VCSELs. The on-wafer testing results in a considerable cost advantage compared with conventional testing techniques used for edge emitting lasers. Furthermore, VCSELs provide reliable operation over time, which is essential for applications in fiber optic systems.

To meet the continuously growing demands for increased bandwidth in telecommunication networks, caused by growing data traffic in big data centers as well as in local and access networks, the inventors have recognized a need for an optimized, high-speed VCSELs with indium phosphide (InP) based active regions that can be applied in optical links that can transmit over long distances (e.g. more than 2 kilometers), which is not possible with standard VCSELs comprising gallium arsenide (GaAs) based active regions.

Embodiments of the present invention utilize an undercut active region such that the data transmission capabilities of a VCSEL are not limited by the parasitic capacitance of traditional VCSEL design. In one example embodiment, a vertical-cavity surface-emitting laser (VCSEL) is provided. The VCSEL may comprise a top reflector and a bottom reflector, and an active cavity material structure disposed between the top reflector and the bottom reflector. The active cavity includes a top current-spreading layer, a bottom current-spreading layer, an active region disposed between the top current-spreading layer and the bottom current-spreading layer, and a tunnel junction overgrown by the top current spreading layer. The tunnel junction is disposed adjacent the active region. The active region is undercut relative to the top current-spreading layer and the bottom current-spreading layer, and within a vertical plane of the VCSEL. Furthermore, a width of the tunnel junction is less than a width of the active region, and a width of the active region is less than a width of the top current-spreading layer.

In some cases, the VCSEL is configured to emit a laser light within a wavelength range comprising a lower wavelength boundary of 1200 nanometers (nm) and an upper wavelength boundary of 1900 nm.

In some examples, the emitted laser light is configured to transmit data at data transmission rate greater than 25 gigabits per second.

In some cases, the top reflector comprises a distributed Bragg reflector (DBR) stack and the bottom reflector comprises a DBR stack.

Additionally, in some examples, the top reflector DRB stack comprises un-doped alternating layers of aluminum gallium arsenide (AlGaAs) and gallium arsenide (GaAs) and wherein the bottom reflector DRB stack comprises un-doped alternating layers of AlGaAs and GaAs.

In some cases, the top current-spreading layer comprises an n-type indium phosphide (InP) layer and the bottom current-spreading layer comprises n-type InP layer.

In some additional cases, the active region further comprises a multi-quantum well (MQW) layer stack comprising a series of quantum wells disposed between a series of barriers, and a p-type region disposed between the top current spreading layer and the MQW layer stack.

In some examples, the p-type region is disposed between the top current spreading region and the bottom current spreading layer, including the MQW layer stack.

In some additional examples, the series of quantum wells and barriers comprises 6 undoped compressively strained indium aluminum gallium arsenide (InAlGaAs) quantum wells and 7 tensile strained InAlGaAs barriers.

In some additional embodiments, the top current-spreading layer and the p-type region forms a reversed-bias p-n junction formed around the tunnel junction, the reversed-bias p-n junction is configured to block a current around the tunnel junction with low capacitance.

In some examples, the tunnel junction comprises a heavily doped p++/n++ indium aluminum gallium arsenide tunnel junction.

In some cases, the tunnel junction defines an optical aperture for a laser light emitted by the VCSEL.

In some examples, the width of the active region comprises a minimum width limited by the width of the tunnel junction, wherein the minimum width is greater than 4 micrometers.

In some example embodiments, the minimum width of the active region is at least 4 micrometers wider than the width of the tunnel junction.

In some examples, the minimum width of the active region is at least 8 micrometers wider than the width of the tunnel junction.

In some cases, the width of the active region comprises a maximum width limited by the width of the top current-spreading layer.

In some cases, the maximum width of the active region is at least 1 micrometer less than the width of the top current-spreading layer.

In some examples, the VCSEL further includes a top contact layer disposed on the top current-spreading layer, and a bottom contact layer disposed on the bottom current-spreading layer.

Additionally, in some example embodiments, the top contact layer comprises an indium gallium arsenide phosphide (InGaAsP) layer and the bottom contact comprises an InGaAsP layer.

In accordance with another example embodiment, a method for manufacturing a vertical-cavity surface-emitting laser (VCSEL) is provided. The method may include forming a body defining: a top reflector and a bottom reflector, and an active cavity material structure disposed between the top reflector and the bottom reflector. The active cavity material of the active region comprising a top current-spreading layer, a bottom current-spreading layer, an active region disposed between the top current-spreading layer and the bottom current-spreading layer, and a tunnel junction. In some examples, the tunnel junction is deposited on the active region and the top current spreading layer is overgrown on top of the tunnel junction. The method further includes etching the body such that the top reflector, the top current-spreading layer and the active region are etched to form a mesa structure, and etching the active region in a lateral direction such that the active region is undercut relative to the top current-spreading layer and the bottom current-spreading layer, and wherein, within a vertical plane of the VCSEL, a width of the tunnel junction is less than a width of the active region, and a width of the active region is less than a width of the top current-spreading layer.

BRIEF DESCRIPTION OF THE DRAWING(S)

Having thus described the invention in general terms, reference will now be made to the accompanying drawings, which are not necessarily drawn to scale, and wherein:

DETAILED DESCRIPTION OF THE INVENTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "bottom," "front," etc. are used for explanatory purposes in the examples provided below to describe the relative position of certain components or portions of components. Accordingly, as an example, the term "top current spreading layer" may be used to describe a current spreading layer; however, the current spreading layer may be on the top or on the bottom, depending on the orientation of the particular item being described.

Figure 1A:
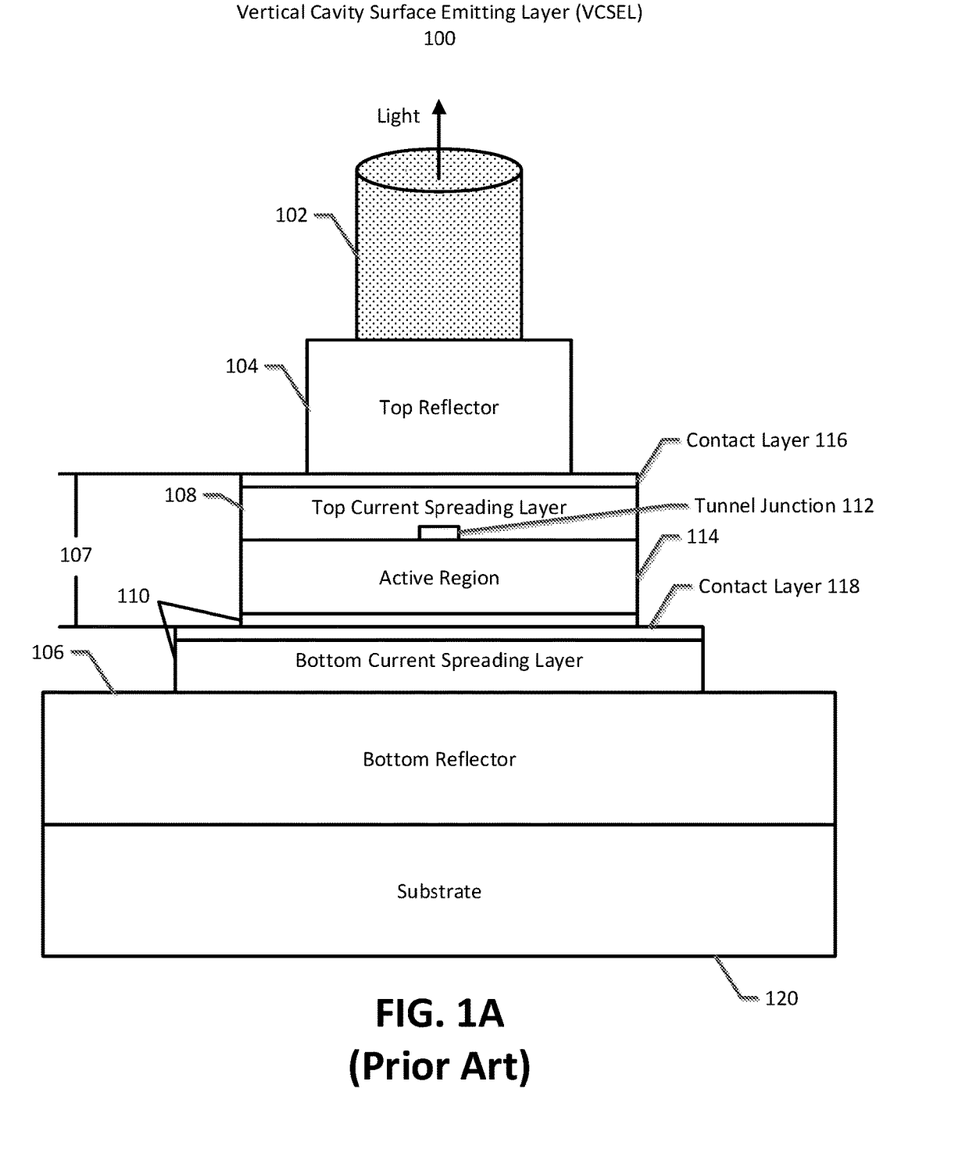
FIG. 1A illustrates a schematic side view of a vertical-cavity surface-emitting laser (VCSEL)

FIG. 1A illustrates a vertical-cavity surface-emitting laser (VCSEL) 100. A typical VCSEL is configured to output light 102 for use in a variety of applications, such as fiber optic data transmission in high-speed fiber optic communication systems. Wafer-fused VCSELs, such as the one illustrated in FIG. 1A, demonstrate good performance in continuous wave (CW) and high speed data transmission, as well as reliable operations important for applications in fiber-optics communication systems. In particular, conventional wafer-fused VCSELs have generally demonstrated both electrical and mechanical durability, such that the VCSELs can be deployed and remain in operation for long periods of time, which is important when constructing a fiber optic network that may face many different environments and stress conditions.

The structure of a conventional VCSEL 100 generally includes an active region disposed between two reflectors. In the example shown in FIG. 1A, the active region 114 is part of a cavity material that is disposed between a top reflector 104 and a bottom reflector 106, the cavity material also including a tunnel junction mesa 112 that is overgrown with a top current spreading layer 108 and a bottom current spreading layer 110. The contact layers 116 and 118 provide electricity to the current spreading layers 108, 110, which in turn provide electricity to the active region 114. The VCSEL 100 structure may be formed on a substrate such as substrate 120.

The current spreading layers 108 and 110 may comprise n-type indium phosphide (n-InP) layers. In the depicted embodiment, providing the electrical contacting through the n-type current spreading layers allows for the top reflector 104 and the bottom reflector 106 to each comprise un-doped semiconductor distributed Bragg reflector (DBR) mirrors or dielectric reflector stacks. For example, the top reflector 104 and the bottom reflector 106 may comprise un-doped alternating layers of aluminum gallium arsenide (AlGaAs) and gallium arsenide (GaAs). In some examples, the manufacturing process of the VCSEL creates a top mesa type structure as shown by the active region 114, the top current spreading layer 108, and the top reflector 104, the mesa structure being formed on top of the underlying structures. This manufacturing process can include reactive ion etching (RIE) and chemical etching through the various layers.

In some examples, the active region 114 may comprise quantum wells, where light 102 is generated, between the reflectors 104 and 106. In some examples, the active region 114 may comprise a multi-quantum well (MQW) layer stack comprising a series of quantum wells disposed between a series of barriers, a p-type region (layer) disposed between the top current spreading layer and the MQW layer stack outside the tunnel junction, and a tunnel junction 112 disposed on the p-type region (layer).

In the depicted VCSEL 100 of FIG. 1A, the tunnel junction 112 serves a dual role of optical (photon) and electrical (current) confinement. The tunnel junction 112 may, for example, comprise an overgrown region which provides both current and photon confinement. In this example, the current is confined by the reverse p-n junction that is formed at the interface between the top current spreading layer 108 and the p-layer. The optical confinement is defined by the tunnel junction 112 representing an aperture for emitting light 102 and is determined by the width (or diameter) of the tunnel junction.

Conventional VCSELs with semiconductor wafer-fused or dielectric reflectors such as VCSEL 100, can be configured to transmit data through single mode optical fibers with a modulation speed of 25 gigabits per second (Gb/s). However, further increasing the modulation speed up to 50 GB/s is limited to great extent by the capacitance of a reverse biased p-n junction, which, in turn is defined by the diameter of the top mesa-structure etched in the n-InP top current spreading layer 108 that overgrows over the tunnel junction 112 mesa (e.g. the junction between the active region 114 and top current spreading layer 108).

The modulation speed of a VCSEL is a function of several device parameters including $\partial g/\partial n$—differential gain, $\tau_p$—photon lifetime, $f_r$—resonance frequency, $f_p$—parasitic frequency, $\gamma$—damping factor and A—an amplitude factor, $\Gamma$—total optical confinement factor, $L_a$—total thickness of the MQWs and R and C which are the series resistance and parasitic capacitance of the VCSEL, respectively.

Figure 1B:
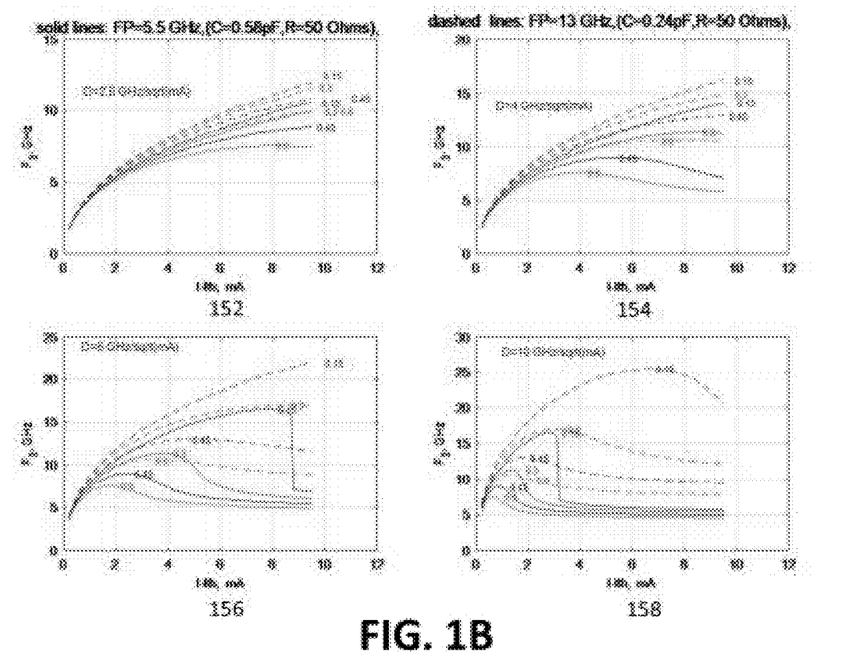
FIG. 1B-1C illustrate graphical results of simulations of VCSEL properties according to device parameters.

Referring now to FIG. 1B, graphs 152, 154, 156, and 158 are simulations representing simulated bandwidth versus operation current for different device parameters. The simulations include D-factors, which quantify the increase of resonance frequency with current with different values of 2.8, 4, 6, and 10 GHz/sqrt (mA). The simulations in each graph also show K-factor with values from 0.15 ns to 0.6 ns in 0.15 ns steps, and parasitic frequency of 6 GHz (solid lines) and 15 GHz (dashed lines).

The modulation bandwidth of 13 GHz (e.g. the bandwidth for 25 GB/s bit rate) can be reached with a D factor as low as 4 $GHz/(mA)^{1/2}$ and a parasitic frequency above 6 GHz. This in turns sets the highest acceptable value for device capacitance of 0.2 pico Farad (pF).

Figure 1C:
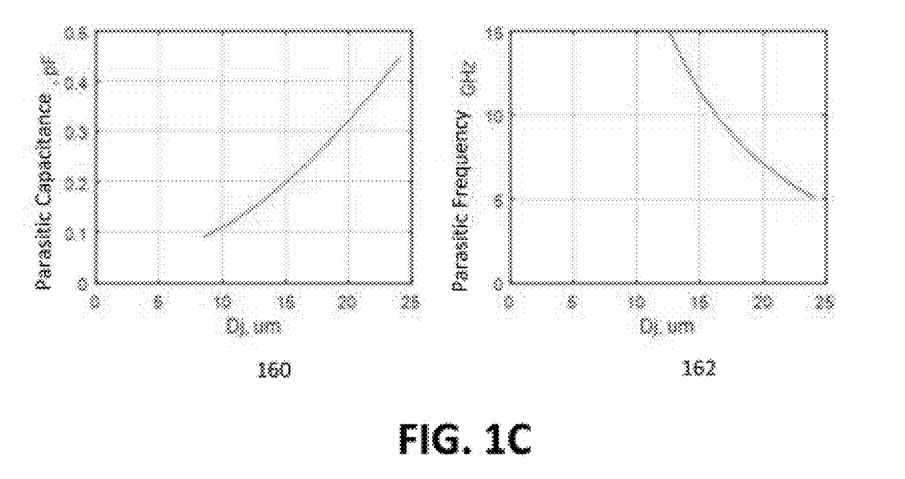

The modulation bandwidth of 25 GHz (e.g. the necessary bandwidth for 50 Gb/s) can be reached with D factor higher than 10 $GHz/(mA)^{1/2}$ and parasitic frequency above 15 GHz. This in turns sets the highest acceptable value for device capacitance of 0.1 pF. In a conventional VCSEL, such as a VCSEL 100 with wafer fused reflectors, which demonstrates 25 Gb/s operation, a diameter of the top overgrown or regrown layer may be equal to about 26 micrometer (μm), which corresponds to the area of about 600 μm². This relatively large diameter of the top InP-mesa is currently required by fabrication tolerances of the top reflector 104 DBR mesa of about 5 μm height and the ohmic contact, which is placed on the top n-InP current spreading layer 108 mesa-structure. In the case of VCSELs with dielectric DBRs, the diameter of the reverse-biased p-n junction (Dj), which is also defined by the diameter of the mesa-structure 107 etched in the n-InP top current spreading layer 108, can be as small as 20 μm because of more relaxed fabrication tolerances of the dielectric DBR and the contact layer that is placed on this mesa-structure. Nevertheless, in order to increase the −3 dB modulation bandwidth to 25 GHz, which would allow data transmission at 50 Gb/s modulation speed, the diameter Dj needs to be further decreased to at least 13 μm. As shown in graphs 160 and 162 of FIG. 1C, parasitic capacitance and parasitic cut-off frequency (the frequency at which the energy flowing through the VCSEL begins to be reduced due to parasitic capacitance) are related to the diameter of the junction Dj. For example, as Dj increases, the parasitic capacitance increases (graph 160). Likewise, as Dj increases, the parasitic cut-off frequency decreases (graph 162).

Conventional VCSELs are described further in "Wafer-fused heterostructures: application to vertical cavity surface-emitting lasers emitting in the 1310 nm band" by Alexei Sirbu, Vladimir Iakovlev, Alexandru Mereuta, Andrei Caliman, Grigore Suruceanu and Eli Kapon, published Nov. 29, 2010 in *Semiconductor Science and Technology*, the entire content of which is incorporated by reference herein in its entirety. Conventional VCSELs are also described further in "Reliability of 1310 nm Wafer Fused VCSELs" by Alexei Sirbu, G. Suruceanu, V. Iakovlev, A. Mereuta, Z. Mickovic, A. Caliman, and E. Kapon published Aug. 15, 2013 in *IEEE Photonics Technology Letters*, VOL. 25, NO. 16, the entire content of which is incorporated by reference herein in its entirety. Conventional VCSELs are also further described in "25 Gbps direct modulation and 10 km data transmission with 1310 nm waveband wafer fused VCSELs" by A. Caliman, A. Mereuta, P. Wolf, A. Sirbu, V. Iakovlev, D. Bimberg and E. Kapon published July 2016 in *Optics Express*, the entire content of which is also incorporated by reference herein in its entirety.

Through hard work and applied ingenuity, the inventors have discovered new techniques and a new design of a VCSEL in which the capacitance of the reverse biased junction at the overgrown interface is not determined by the diameter of the mesa-structure formed in the n-InP current spreading layer that is overgrown over the tunnel junction mesa, but by a diameter of an undercut active region that is introduced in the VCSEL designs described herein, in order to further reduce the area of the reverse biased junction as compared with existing VCSEL designs.

Figure 2:
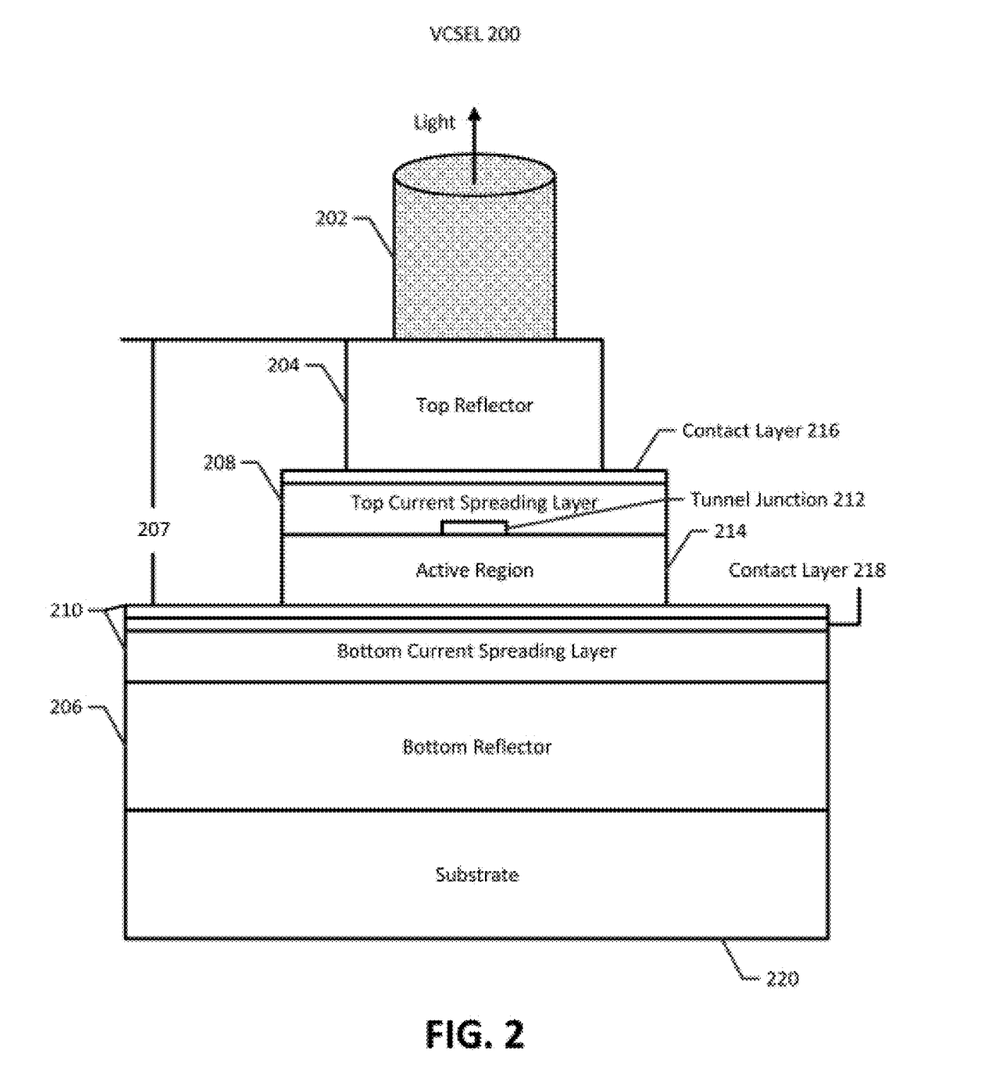
FIG. 2 illustrates a schematic side view of a VCSEL according to an example embodiment.
Figure 3:
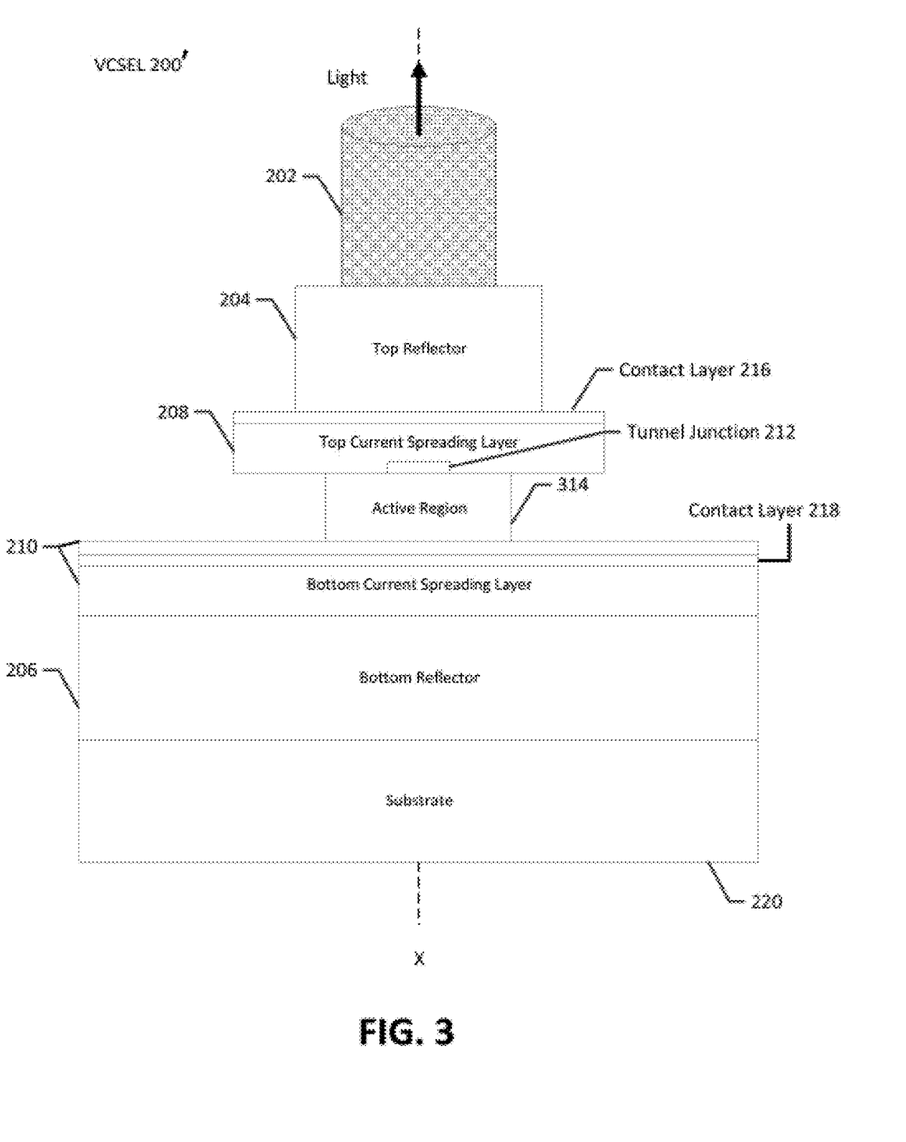
FIG. 3 illustrates a schematic side view of a VCSEL comprising an undercut active region according to an example embodiment.

FIGS. 2-3 illustrate a VCSEL according to an example embodiment. Specifically FIG. 2 illustrates a VCSEL 200, prior to the active region 214 being undercut. VCSEL 200, in a similar manner to that of VCSEL 100, is configured to output light 202 for use in a variety of applications such as a fiber optic data transmission in high-speed fiber optic communication systems. The VCSEL 200 of FIG. 2, like the VCSEL 100 of FIG. 1A, may comprise a wafer-fused VCSEL, allowing the VCSEL 200 to demonstrate good performance in continuous wave (CW) and high speed data transmission as well as operational reliability for applications in fiber-optics communication systems. The VCSEL 200 further includes a similar overall structure to that of the VCSEL 100, including an active region that is part of a cavity material that is disposed between two reflectors. Besides active region 214, the cavity material is also including a tunnel junction mesa 212 that is overgrown with the top current spreading layer 208, and a bottom current spreading layer 210. The contact layers 216 and 218 are configured to provide electricity to the current spreading layers 208 and 210, which in turn provide electrical contacting to the active region 214. The VCSEL 200 structure may be formed on a substrate such as substrate 220.

The current spreading layers 208 and 210 may each comprise an n-type InP layer in a similar manner to the VCSEL 100 of FIG. 1A, providing the electrical contacting through the n-type current spreading layers allows for the top reflector 204 and the bottom reflector 206 to each comprise un-doped semiconductor distributed Bragg reflector (DBR) mirrors or dielectric reflector stacks. For example, the top reflector 104 and the bottom reflector 106 may comprise un-doped alternating layers of aluminum gallium arsenide (AlGaAs) and gallium arsenide (GaAs), which are described in further detail below in connection with FIG. 4. In some examples, the manufacturing process for making the VCSEL 200 creates a top mesa type structure 207 as shown in FIG. 2, including the active region 214, the top current spreading layer 208, and the top reflector 204. This manufacturing process can include reactive ion etching (RIE) and chemical etching through the various layers.

The active region 214 comprises quantum wells, where light 202 is generated, between the reflectors 204 and 206. The active region 214 may comprise a multi-quantum well (MQW) layer stack consisting of a series of quantum wells disposed between a series of barriers and a p type region (layer) situated between the top current spreading layer and the MQW layer stack outside the tunnel junction. In the tunnel junction aperture region 212, the p-type region (layer) is disposed between MQW layer stack and the tunnel junction 212. The active region is described in further detail in relation to FIG. 5.

In the VCSEL 200, the tunnel junction 212 serves the dual role of optical and electrical confinement. The tunnel junction 212 may comprise an overgrown region which provides current and photon confinement. The current is confined by the reverse p-n junction that is formed at the interface between the top current spreading layer 108 and the p-region (layer) 510. The aperture for emitting light 202 is defined by the width or diameter of the tunnel junction. A method for manufacturing or fabricating the VCSEL 200, shown in FIG. 2, is described in greater detail in relation to FIG. 6 below.

FIG. 3 illustrates a VCSEL 200' comprising an undercut active region 314. The process for creating the undercut active region 314 shown in FIG. 3 in the structure 200 of FIG. 2 is discussed in greater detail in relation to FIG. 6.

The embodiment of the VCSEL 200' of FIG. 3, including the undercut active region 314, is capable of emitting a light 202 (laser light) within a wavelength range comprising a lower wavelength boundary of 1200 nanometers (nm) and an upper wavelength boundary of 1900 nm and to transmit data at a data transmission rate greater than 25 gigabits per second. Furthermore, as described above the tunnel junction 212 defines an optical aperture for the light 202 (laser light) emitted by the VCSEL.

The VCSEL 200' is also characterized by a top contact layer 216 disposed on the top current-spreading layer 208 and a bottom contact layer 218 disposed on the bottom current-spreading layer 210, as shown in FIGS. 2 and 3. In some embodiments, the contact layers 216 and 218 each comprise an indium gallium arsenide phosphide (InGaAsP) layer.

Figure 4:
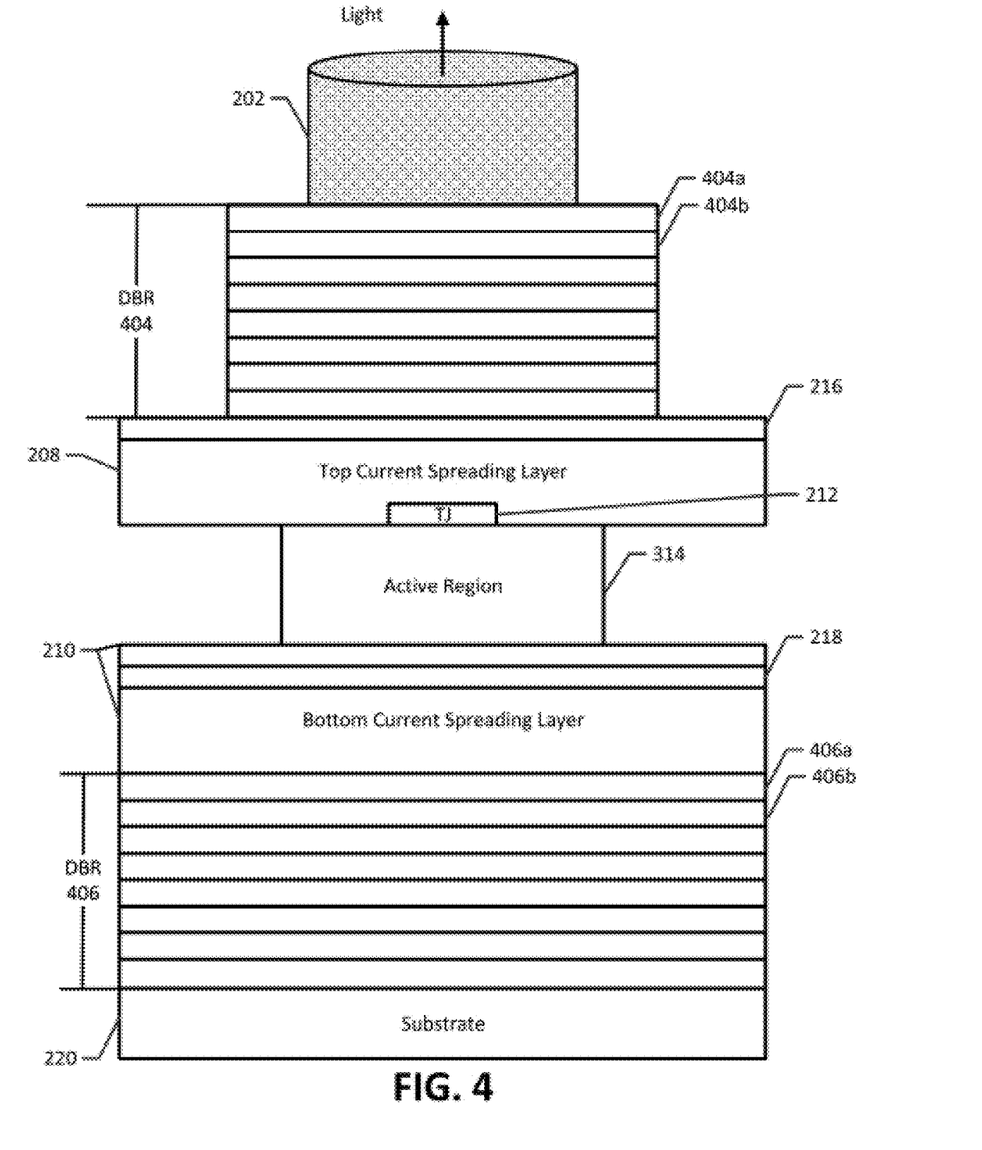
FIG. 4 illustrates a schematic side view of components of a VCSEL comprising an undercut active region according to an example embodiment.

FIG. 4 illustrates a schematic side view of components of a VCSEL comprising an undercut active region according to an example embodiment. Specifically, FIG. 4 shows a zoomed in and detailed view of the VCSEL 200' shown in FIG. 3. In particular, the top reflector 204 and the bottom reflector 206 are shown as DBR reflector 404 and DBR reflector 406. In some examples, DBR 404 and DBR 406 comprise distributed Bragg reflector (DBR) stacks, as shown in FIG. 4. These stacks may comprises un-doped alternating layers of aluminum gallium arsenide (AlGaAs) and gallium arsenide (GaAs), shown by layers 404a and 404b for DBB 404 and layers 406a and 406b for DBB 406.

Figure 5:
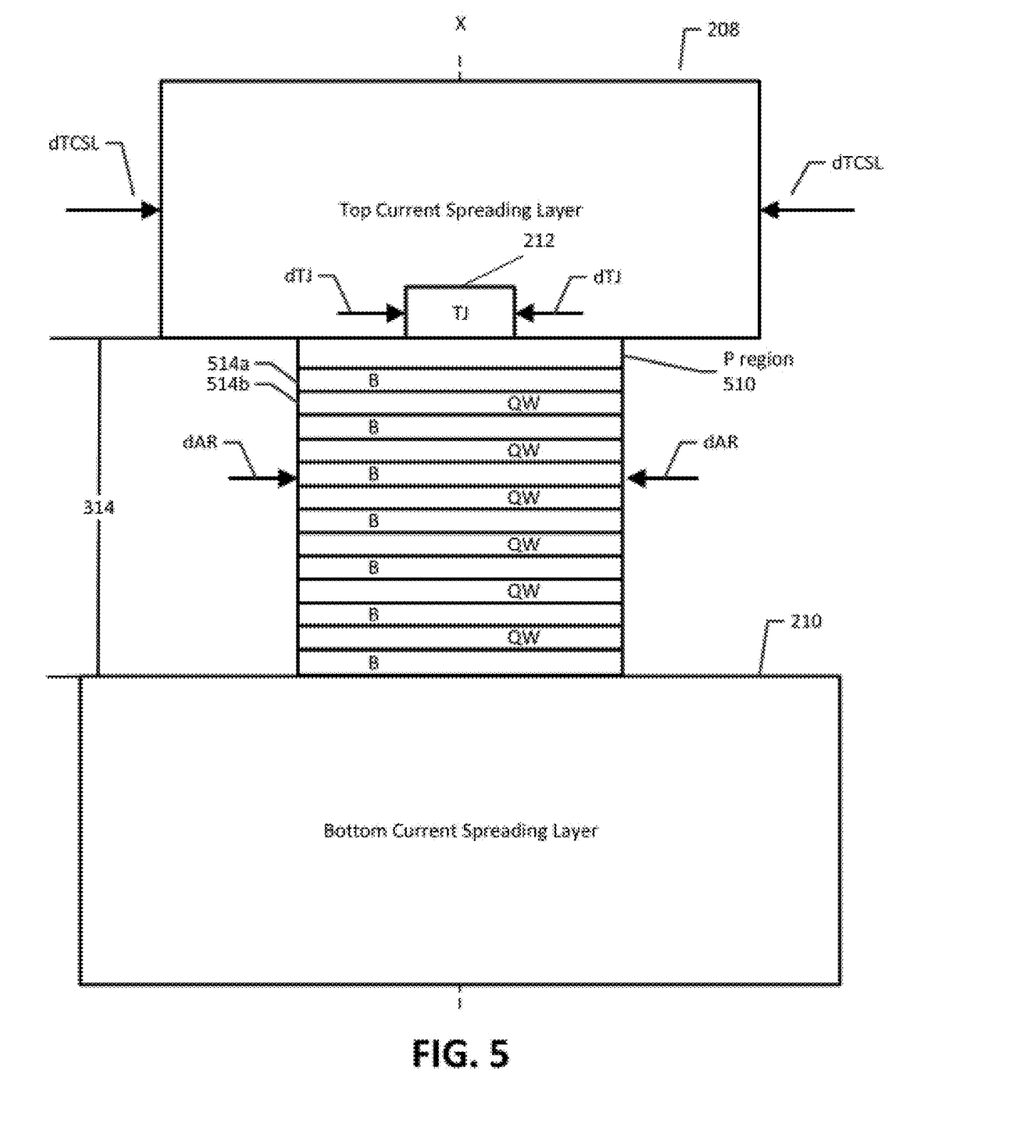
FIG. 5 illustrates a schematic side view of components of a VCSEL comprising an undercut active region according to an example embodiment.

FIG. 5 illustrates a schematic side view of components of a VCSEL 200' comprising an undercut active region according to an example embodiment. Specifically, FIG. 5 shows a further zoomed in and detailed view of the region between the top current spreading layer 208 and the bottom current spreading layer 210 in the VCSEL 200' shown in FIG. 3.

As shown, the undercut active region 314 may include a multi-quantum well (MQW) layer stack comprising a series of quantum wells, such as in the layers 514b, disposed between a series of barriers, such as in the layers 514a. In some embodiments, the series of quantum wells and barriers may comprise six undoped compressively strained, indium aluminum gallium arsenide (InAlGaAs) quantum wells (shown as QW in FIG. 5), and seven tensile strained InAlGaAs barriers (shown as B in FIG. 5).

The undercut active region 314, may also include a multi-quantum well (MQW) layer stack comprising a series of quantum wells and barriers that may comprise p-type doped indium aluminum gallium arsenide (InAlGaAs) quantum wells and InAlGaAs barriers. The VCSEL 200' as shown in FIG. 3 is configured such that the top current-spreading layer 208 is part of a reversed-bias p-n junction formed around the tunnel junction 212, wherein the reversed-bias p-n junction is configured to block a current around the tunnel junction.

Likewise, the tunnel junction 212 may comprise a heavily doped p++/n++ indium aluminum gallium arsenide tunnel junction, such that it defines an optical aperture for light 202 (laser light) emitted by the VCSEL.

Furthermore as shown in FIG. 5, the widths of the undercut active region 314 and the surrounding layers may be constrained to maximize the advantageous properties of the VCSEL. The width of the undercut active region 314 is shown as the width dAR, the width of the top current spreading layer 208 is shown as the width dTCSL, and the width of the tunnel junction 212 is shown as the width dTJ. In some embodiments, the minimum width of width dAR comprises a minimum width limited by the width dTJ, wherein the minimum width is greater than 4 micrometers. In another example, width dAR may be limited by the value: width dTJ+4 µm, such that the optical mode, which extends up to 2 µm outside the radius of the aperture defined by the tunnel junction 212, is not disturbed by the edge of the undercut active region 314. In some examples, the minimum value or minimum width of width dAR may be further increased, by another 4 µm to account for an optical photolithography alignment tolerance when aligning the center of the top current spreading layer 216 with the center of the tunnel junction 212 mesa.

Furthermore, the maximum value of width dAR should be at least width dTCSL−1 µm. This maximum value represents the width of the undercut active region 314 at which the effect of reducing the reverse p-n junction area on the capacitance starts to be measurable, such that the VCSEL can increase modulation speeds above 25 GB/s.

Figure 6:
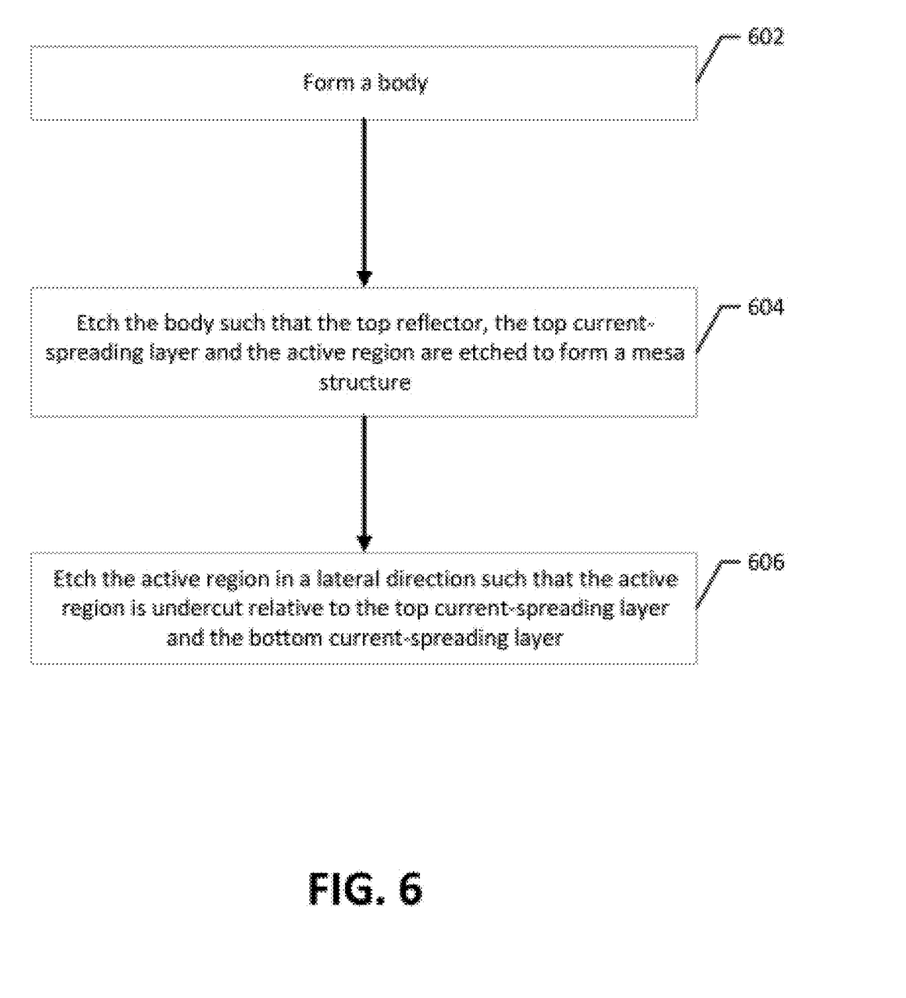
FIG. 6 is a flowchart illustrating an example method for manufacturing a VCSEL according to example embodiments.

FIG. 6 is a flowchart illustrating an example method for manufacturing a VCSEL according to example embodiments. Fabrication techniques may be utilized including dry and wet etching, as described above. As shown in block 602, the manufacturing of the VCSEL may include forming a body defining a top reflector 204 and a bottom reflector 206; an active cavity material structure comprising a top current-spreading layer 208, a bottom current-spreading layer 210, an active region 214 disposed between top current-spreading layer 208 and the bottom current-spreading layer 210; and a tunnel junction 212 overgrown by the top current spreading layer 208. In some examples, the tunnel junction 212 is deposited on the active region 214 and top current spreading layer 208 is overgrown on top of the tunnel junction. The method may also include etching the body such that the top reflector, the top current-spreading layer, and the active region are etched to form a mesa structure 207 as shown in FIG. 2.

In one example, forming the body as described above comprises depositing the top reflector 204 and the bottom reflector 206 on different GaAs substrates, such as substrate 220. Forming the body further comprises depositing on an InP substrate a bottom current spreading layer 210, an active region 214 on a bottom current spreading layer 210, and a tunnel junction layer 212 on top of active region 214. Forming the body also further comprises, forming a mask on the tunnel junction layer that is on top of the active region 214, such that the shape of the tunnel junction 212 is formed by the mask, etching the tunnel junction, such as by chemical etching, outside the mask to form a tunnel junction mesa, shown as tunnel junction 212, and then removing the mask. After the mask is removed, the process is continued by overgrowing the top current spreading layer 208 on the surface of the active region that contains the tunnel junction 212 mesa. Thus, the current spreading layer is formed on top of the already formed tunnel junction 212 mesa structure and outside the mesa structure, as well. The top reflector 204 can then be bonded on top of the top current spreading layer 208. After the InP substrate is removed, the bottom current spreading layer is bonded on the bottom DBR. At the conclusion of this step the GaAs substrate of the top DBR is removed to finalize the body as described in block 602, the VCSEL will have a structure such as that of the VCSEL 200 shown in FIG. 2.

As shown in block 604, the manufacturing of the VCSEL may further include etching the top reflector 204, the top current spreading layer 208, the top contact layer 216, and the active region 214 until the etching reaches the bottom current spreading layer to form a mesa structure 207 as shown in FIGS. 2 and 3. After reaching bottom current spreading layer 210, this etching step is stopped.

As shown in block 606, the manufacturing of the VCSEL may further include etching the active region 214 in a lateral direction towards axis X, shown in FIGS. 3 and 5, such that the undercut active region 314 is undercut relative to the top current-spreading 208 layer and the bottom current-spreading layer 210. As a result, within a vertical plane of the VCSEL passing through axis X, a width of the tunnel junction 212 is less than a width of the active region 314, and a width of the active region 314 is less than a width of the top current-spreading layer 208. The etching done in the lateral direction may consist of wet etching the active region 214 in a citric acid-peroxide solution. The etching of the active region 214 in the lateral direction to form the undercut active region 314 may include etching the active region to within a required width or diameter, such as previously discussed in greater detail in relation to FIG. 5, above. After the formation of the undercut active region 314, the manufacturing process may continue by applying photolithography and selective chemical etching steps to complete the VCSEL structure shown in FIG. 3.

After the VCSEL 200' structure is complete as shown in FIG. 3, additional standard VCSEL production and processing steps may be performed, including the deposition of silicon nitride Si3N4, as well as the formation of metal contacts and contacts pads that are standard in the fabrication of these types of structures.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A vertical-cavity surface-emitting laser (VCSEL) having a reduced parasitic capacitance, the VCSEL comprising:
   a top reflector and a bottom reflector;
   an active cavity material structure disposed between the top reflector and the bottom reflector comprising:
      a top current-spreading layer;
      a bottom current-spreading layer;
      an active region disposed between the top current-spreading layer and the bottom current-spreading layer; and
      a tunnel junction overgrown by the top current spreading layer, wherein the tunnel junction is disposed within the top current spreading layer and bordered on one surface thereof by the active region;
   wherein the active region is undercut relative to the top current-spreading layer and the bottom current-spreading layer;
   wherein, within a vertical plane of the VCSEL, a width of the tunnel junction is less than a width of the active region, and a width of the active region is less than a width of the top current-spreading layer; and
   wherein the width of the active region is in a range defined by a minimum width and a maximum width, the minimum width is 4 μm greater than the width of the tunnel junction and the maximum width is 1 μm less than the width of the top current-spreading layer.

2. The VCSEL of claim 1, wherein the VCSEL is configured to emit a laser light within a wavelength range comprising a lower wavelength boundary of 1200 nanometers (nm) and an upper wavelength boundary of 1900 nm.

3. The VCSEL of claim 2, wherein the emitted laser light is configured to transmit data at data transmission rate greater than 25 gigabits per second.

4. The VCSEL of claim 1, wherein the top reflector comprises a distributed Bragg reflector (DBR) stack and wherein the bottom reflector comprises a DBR stack.

5. The VCSEL of claim 4, wherein the top reflector DBR stack comprises un-doped alternating layers of aluminum gallium arsenide (AlGaAs) and gallium arsenide (GaAs) and wherein the bottom reflector DBR stack comprises un-doped alternating layers of AlGaAs and GaAs.

6. The VCSEL of claim 1, wherein the top current-spreading layer comprises an n-type indium phosphide (InP) layer and wherein the bottom current-spreading layer comprises n-type InP layer.

7. The VCSEL of claim 1, wherein active region further comprises:
   a multi-quantum well (MQW) layer stack comprising a series of quantum wells disposed between a series of barriers; and
   a p-type region disposed between the top current spreading layer and the MQW layer stack.

8. The VCSEL of claim 7, wherein the p-type region is disposed between the top current spreading region and the bottom current spreading layer, including the MQW layer stack.

9. The VCSEL of claim 7, wherein the series of quantum wells and barriers comprises 6 undoped, compressively strained indium aluminum gallium arsenide (InAlGaAs) quantum wells and 7 tensile strained InAlGaAs barriers.

10. The VCSEL of claim 7, wherein the top current-spreading layer and the p-type region forms a reversed-bias p-n junction formed around the tunnel junction, wherein the reversed-bias p-n junction is configured to block a current around the tunnel junction.

11. The VCSEL of claim 1, wherein the tunnel junction comprises a heavily doped p++/n++ indium aluminum gallium arsenide tunnel junction.

12. The VCSEL of claim 1, wherein the tunnel junction defines an optical aperture for a laser light emitted by the VCSEL.

13. The VCSEL of claim 1, wherein the minimum width of the active region is at least 8 micrometers wider than the width of the tunnel junction.

14. The VCSEL of claim 1, further comprising:
   a top contact layer disposed on the top current-spreading layer; and
   a bottom contact layer disposed on the bottom current-spreading layer.

15. The VCSEL of claim 14, wherein the top contact layer comprises an indium gallium arsenide phosphide (InGaAsP) layer and wherein the bottom contact comprises an InGaAsP layer.

16. A method for manufacturing a vertical-cavity surface-emitting laser (VCSEL) having a reduced parasitic capacitance, the method comprising:

forming a body defining:
- a top reflector and a bottom reflector;
- an active cavity material structure disposed between the top reflector and the bottom reflector comprising:
  - a top current-spreading layer;
  - a bottom current-spreading layer;
  - an active region disposed between the top current-spreading layer and the bottom current-spreading layer; and
  - a tunnel junction, wherein the tunnel junction is deposited on the active region and wherein the top current spreading layer is overgrown on top of the tunnel junction such that the tunnel junction is disposed at least partially within the top current spreading layer and one surface of the tunnel junction is bordered by the active region;
- etching the body such that the top reflector, the top current-spreading layer and the active region are etched to form a mesa structure; and
- etching the active region in a lateral direction such that the active region is undercut relative to the top current-spreading layer and the bottom current-spreading layer; and wherein, within a vertical plane of the VCSEL, a width of the tunnel junction is less than a width of the active region, and a width of the active region is less than a width of the top current-spreading layer,
- wherein the width of the active region is in a range defined by a minimum width and a maximum width, the minimum width is 4 µm greater than the width of the tunnel junction and the maximum width is 1 µm less than the width of the top current-spreading layer.

* * * * *